United States Patent [19]

Hsue et al.

[11] Patent Number: 5,472,899
[45] Date of Patent: Dec. 5, 1995

[54] PROCESS FOR FABRICATION OF AN SRAM CELL HAVING A HIGHLY DOPED STORAGE NODE

[75] Inventors: Chen-Chiu Hsue; Sun-Chieh Chien, both of Hsin-Chu, Taiwan

[73] Assignee: United Microelectronics Corporation, Hsinchu, Taiwan

[21] Appl. No.: 216,353

[22] Filed: Mar. 23, 1994

[51] Int. Cl.[6] .............................. H01L 21/70; H01L 27/00
[52] U.S. Cl. .................... 437/52; 437/47; 437/60
[58] Field of Search ................................. 437/52, 47, 60, 437/48, 27, 984, 44, 41; 257/379–381, 903–904

[56] References Cited

U.S. PATENT DOCUMENTS

| | | | |
|---|---|---|---|
| 4,950,617 | 8/1990 | Kumagai et al. | 437/41 |
| 5,057,893 | 10/1991 | Sheng et al. | 357/41 |
| 5,198,386 | 3/1993 | Gonzalez | 437/52 |
| 5,426,065 | 6/1995 | Chan et al. | 437/52 |

OTHER PUBLICATIONS

"A New Process Technology for a 4Mbit SRAM with Polysilicon Load Resistor Cell", K. Yuzuriha et al, Symposium on VLSI Technology, pp. 61–62 (1989).

Primary Examiner—Olik Chaudhuri
Assistant Examiner—H. Jey Tsai
Attorney, Agent, or Firm—George O. Saile; Graham S. Jones, II

[57] ABSTRACT

An SRAM cell and a process for forming an SRAM cell comprises: forming a gate oxide layer on a semiconductor substrate, forming a gate on the gate oxide layer, forming a first ion implantation into the substrate in areas adjacent to the gate, performing a second ion implantation in an area immediately adjacent to the gate, depositing a dielectric layer over the gates, etching the dielectric layer to form a spacer structure therefrom, with the remainder of the dielectric layer being removed by the etching, and a third ion implantation in the substrate in all regions adjacent to the gates and the spacer forming more highly doped regions adjacent to the gate and the spacer.

8 Claims, 8 Drawing Sheets

PROCESS FOR FABRICATION OF AN SRAM CELL HAVING A HIGHLY DOPED STORAGE NODE

BACKGROUND OF THE INVENTION

1. Field of the Invention

This invention relates to SRAM cells and more particularly to a process for fabrication thereof.

2. Description of Related Art

U.S. Pat. No. 5,057,893 of Sheng et al for "Static RAM Cell with Soft Error Immunity" shows the use of a second spacer on some devices.

Figure 1:
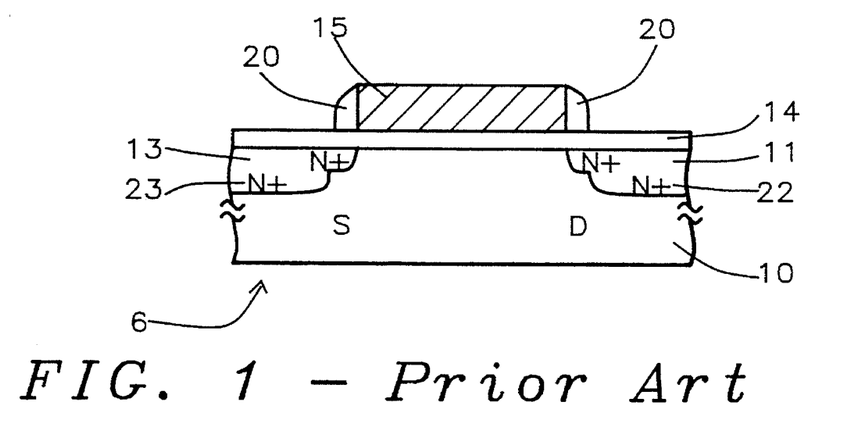
FIG. 1 shows a prior art SRAM (Static Random Access Memory) device.

FIG. 1 shows a prior art SRAM (Static Random Access Memory) device 6 with a substrate 10 composed of silicon having formed thereon a symmetrical LDD (Lightly Doped Drain) device. The device includes a gate oxide layer 14 upon which a polysilicon gate 15 is formed with spacers 20 on either side. Beneath the spacers 20 are N− doped regions 13 and 11 in the Source and Drain regions of the device. Aside from the spacers 20 and N− doped regions 13 and 11 are N+ doped regions 23 and 12 which have higher concentrations of dopant added after the N− dopant has been implanted and the spacers 20 have been formed.

Figure 2:
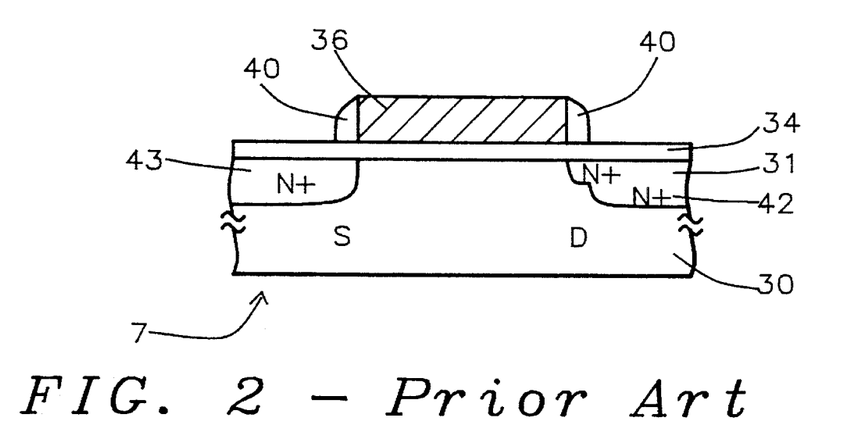
FIG. 2 shows a prior art device with a substrate composed of silicon having formed thereon an asymmetrical LDD (Lightly Doped Drain) including a gate oxide layer upon which a polysilicon gate is formed with a spacer structure on either side.

FIG. 2 shows a prior art device 7 with a substrate 30 composed of silicon having formed thereon an asymmetrical LDD (Lightly Doped Drain) including a gate oxide layer 34 upon which a polysilicon gate 36 is formed with spacers 40 on either side. Beneath only the right side spacer 40 is an N− doped region 31 in the Drain region of the device. Aside from the spacers 40 and the N− doped regions 31 are N+ doped regions 43 and 42 which have higher concentrations of dopant added after the N− dopant has been implanted and the spacers 40 have been formed.

The Idsat of the Symmetrical LDD Structure is reduced (suffers) from about 10% to about 50% depending upon the source side N− concentration. The asymmetrical LDD with N+ on the source side can improve (increase) Idsat without any sacrifice in device performance (i.e. breakdown voltage, snapback voltage, Hct e- Reliability, etc.)

Using an asymmetric LDD Device in an SRAM Memory Cell, as shown in FIG. 2, one extra mask is used to open the source side of the drive device, then using an N+ (i.e. 1E15 As$^+$) implant, improves the cell ratio from about 20% to about 40% or can reduce cell size with the same cell ratio.

The cell ratio (current) is defined as follows:

$$R_c = \frac{T3}{T1} - \frac{Idsat \text{ of } T3 \text{ (drive device)}}{Idsat \text{ of } T1 \text{ (pass device)}}$$

Figure 7:
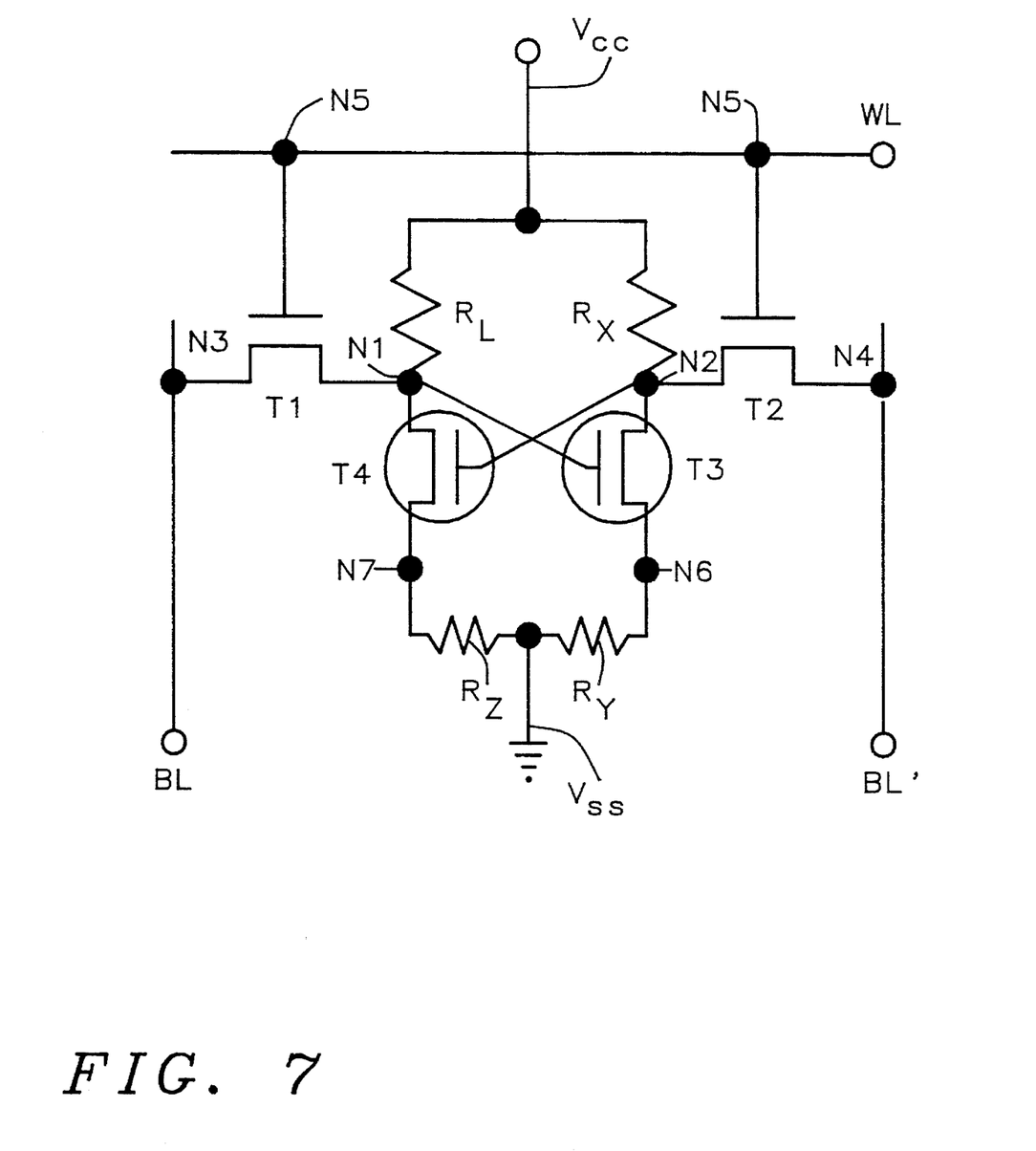
FIGS. 7 shows a schematic circuit diagram of an SRAM cell.

An example is shown in FIG. 7. In the polysilicon load SRAM cell this ratio is typically kept around 3 for cell stability, and the larger the value, the better. If one increases the device current, the cell ratio will increase, so then one can reduce the width of the drive device while keeping the same cell ratio $R_c$.

Figure 3:
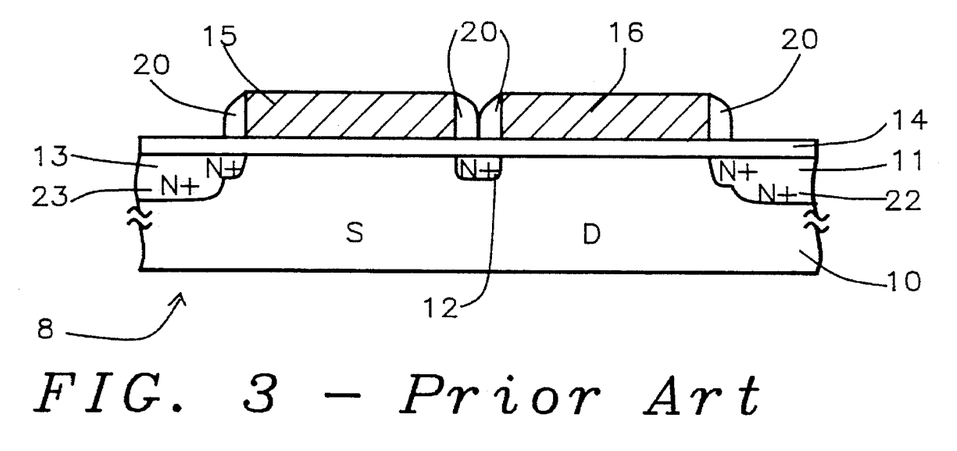
FIG. 3 shows a prior art device with a substrate composed of silicon with the device comprising a symmetrical LDD (Lightly Doped Drain) including a gate oxide layer upon which polysilicon gates are formed with spacers on either side.

FIG. 3 shows a prior art device with a substrate 10 composed of silicon with the device comprising a symmetrical LDD (Lightly Doped Drain) including a gate oxide layer 14 upon which polysilicon gates 15 and 16 are formed with spacers 20 on either side. Beneath the spacers 20 are N− doped regions 11, 12 and 13 in the Source and Drain regions of the device. Aside from the spacers 20 and N− doped regions 11, 12 and 13 are N+ doped regions 23 and 12 which have higher concentrations of dopant added after the N− dopant has been implanted and the spacers 20 have been formed. For example, sub-half-micron spacers will block N+ S/D implants or increase S/D resistance.

A problem is illustrated by FIG. 3, which is based on a case in which cell geometry has become far smaller to the extent that the oxide spacer blocks the N+ S/D implant thereby dramatically increasing the S/D resistance. As in FIG. 8B, T3 and T7 spacing will be too small, the spacer will block the N+ S/D implant, and increase the S/D resistance. The increased source resistance Ry (Rz) in FIG. 7 will impact cell stability as shown in FIG. 6 of "A New Process Technology for a 4 Mbit SRAM with Polysilicon Load Resistor Cell" K. Yuzuriha et al, Symposium on VLSI Technology, pp 61–62 (1989), so a ground resistance as low as possible is required.

The process of formation of a device of the kind shown in FIG. 3 is described here to illustrate the problem of providing an adequate level of dopant in the space between adjacent gate elements 15 and 16, in more detail.

Figure 4:
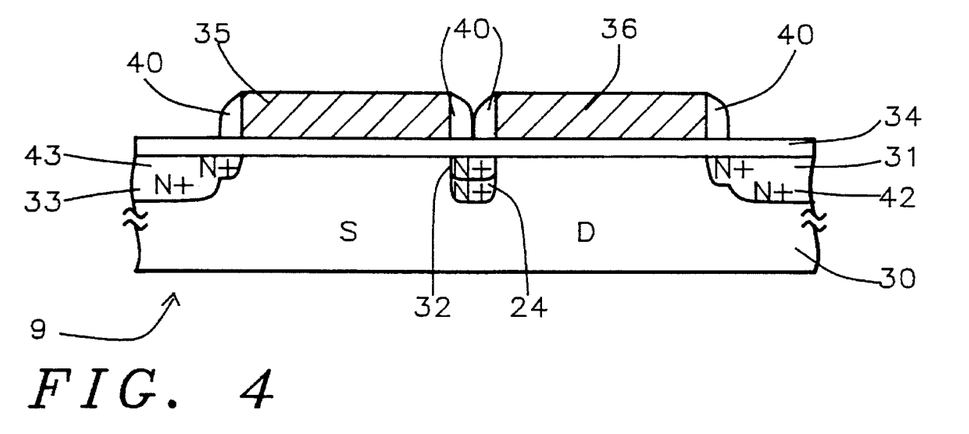
FIG. 4 shows a device in accordance with this invention.

FIG. 4 shows a device in accordance with this invention.

Figure 5A:
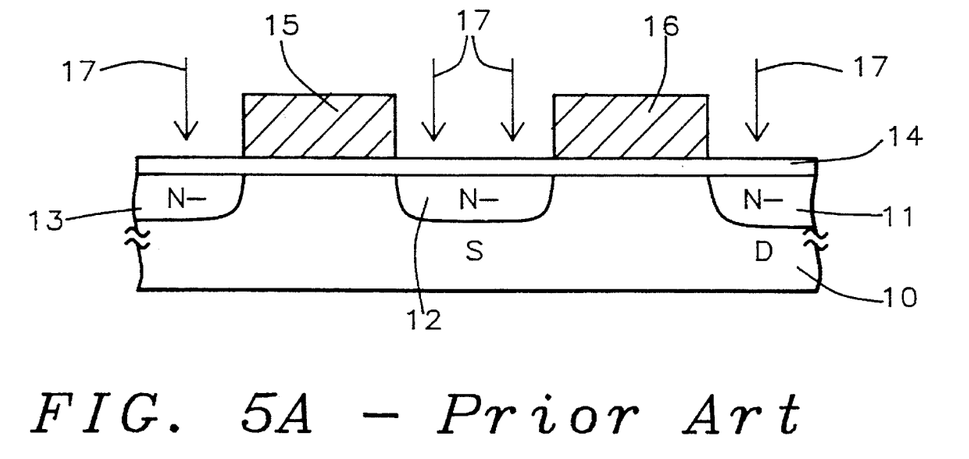
FIGS. 5A–5C illustrate a prior art process of making a device similar to the device shown in FIG. 3 and FIGS. 6A–6D illustrate the process of making a device similar to the device shown in FIG. 4.
Figure 5B:
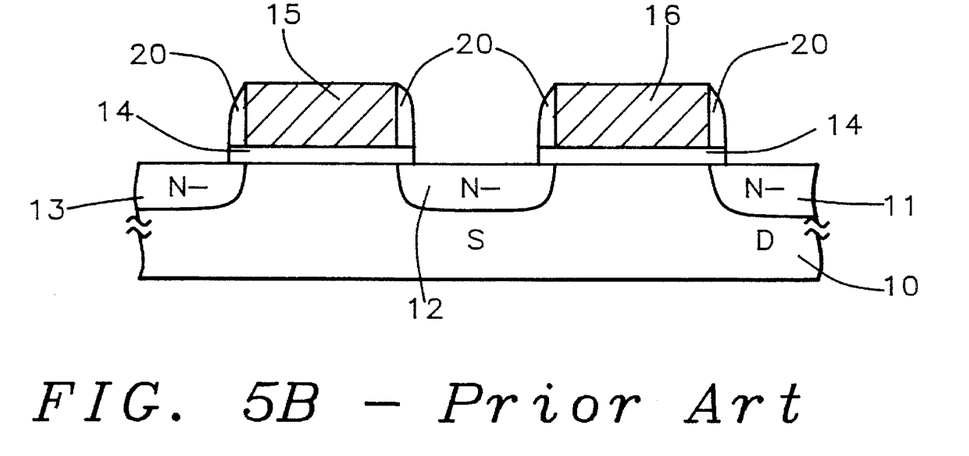
Figure 5C:
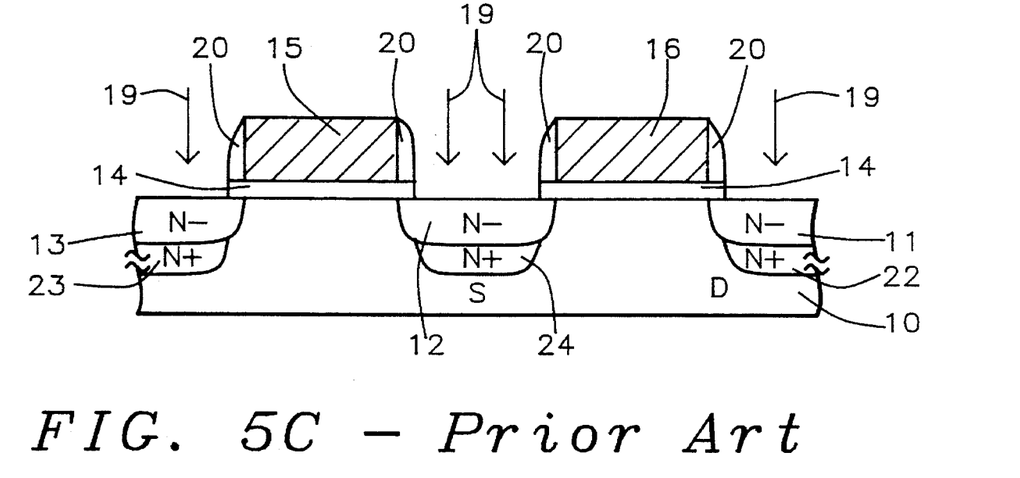

FIGS. 5A–5C illustrate a prior art process of making a device similar to the device shown in FIG. 3 and FIGS. 6A–6D illustrate the process of making a device similar to the device shown in FIG. 4. Moreover, the process steps shown in FIGS. 6A–6D show a process in accordance with this invention which is modification of the process shown in FIGS. 5A–5C.

Figure 6A:
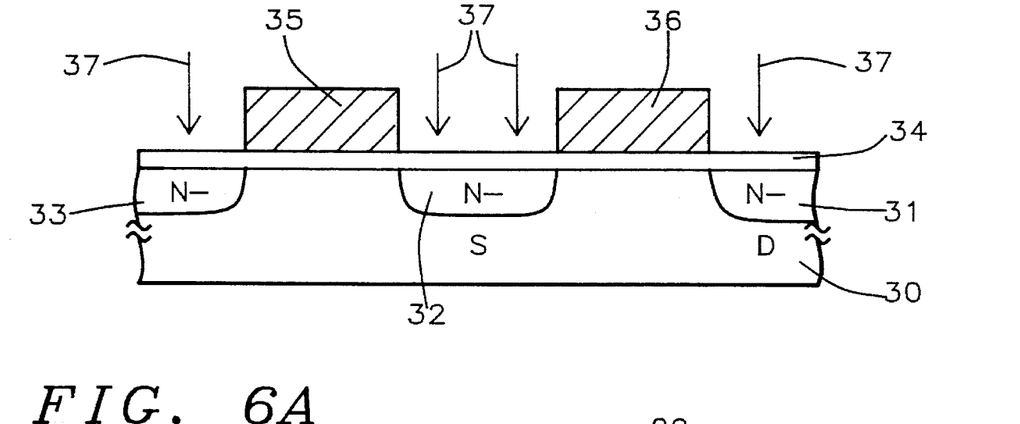
FIGS. 6A–6D show process steps in accordance with this invention which is modification of the process shown in FIGS. 5A–5D.

In brief, FIG. 5A shows the results of the preliminary set of steps of manufacture of a device similar to the device of FIG. 3, with corresponding elements having similar reference numbers to those in FIG. 3. FIG. 5A shows the device, after the gate oxide layer 14 was formed, an N− ion implant process was performed resulting in identical structures. FIG. 6A shows the result of the preliminary set of steps of manufacture of a device of the kind shown in FIG. 4, which is an alternative process to that used to produce the device of FIG.3 Ions 17 have been implanted in silicon semiconductor substrate 10 forming N− regions 11, 12, and 13 in FIG. 5A and ions 37 have been implanted in silicon semiconductor substrate 30 forming N− regions 31, 32, and 33 in FIG. 6A.

Figure 6B:
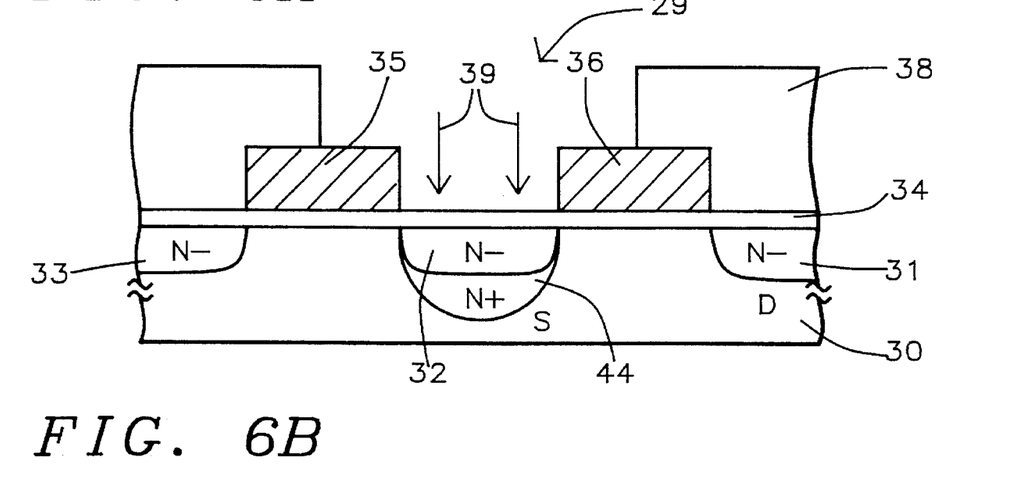

In FIG. 6B, a photoresist mask 38 has been applied over the device of FIG. 6A, but in accordance with this invention as illustrated in FIG. 6B, the mask 38 has been patterned with and opening 29 on the source side of the device for an N+ ion implant step as illustrated with ions 39 being implanted therein.

Figure 6C:
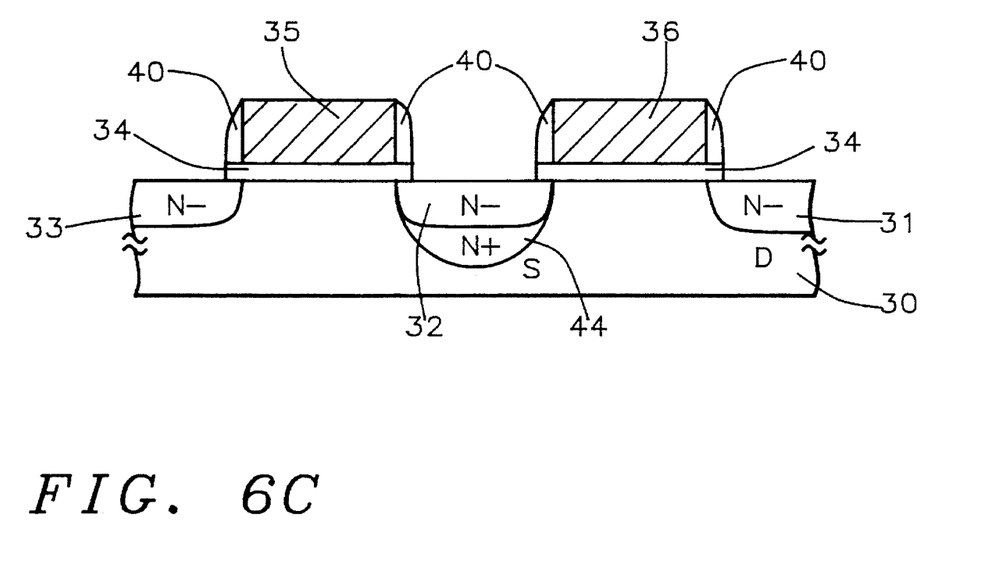

To produce the product of FIG. 5B from the device of FIG. 5A, a CVD deposit of silicon dioxide layer 20 is made followed by a spacer etchback leaving the silicon dioxide spacers 20 shown in FIG. 5B. In an identical process, the product of FIG. 6C is produced from the device of FIG. 6B, a CVD deposit of silicon dioxide layer 40 is made followed by a spacer etchback leaving the silicon dioxide spacers 20 shown in FIG. 5B.

To produce the product of FIG. 5C from the device of FIG. 5B, an N+ implant of arsenic (As) ions 19 has been made thereon. To produce the product of FIG. 6D from the device of FIG. 6C, an N+ implant of As ions 59 has been made thereon producing an asymmetric device as can be seen by comparison of the regions 24 and 44 in the source sides of the devices of FIGS. 5C and 6D.

The prior art process comprises the steps as follows:

Form a gate oxide layer 14 on a silicon semiconductor substrate 10, as is well known to those skilled in the art.

Form a polysilicon layer for gate structures 15 and 16 on the gate oxide layer by forming a polysilicon layer on the gate oxide layer.

Form a mask for polysilicon gate structures by use of photolithography

Perform an etching processes in accordance with the art, as shown in FIG. 5A to form the gate structures 15 and 16 from the polysilicon layer.

Perform an N– ion implantation of phosphorous (P) ions 17 into said substrate 10 in all areas exposed adjacent to the polysilicon structures 15 and 15 forming N– regions 13, 12 and 11, as shown in FIG. 5A.

Form an N+ photoresist mask 18 on the device of FIG. 5A.

Referring again to U.S. Pat. No. 5,057,893, there is no ion implantation step. In addition there is no step of application of a mask at this stage in prior art processes.

Perform a CVD silicon dioxide deposition of layer 20 over the device covering the polysilicon gates 15 and 16, etc.

Etch the silicon dioxide layer 20 to form spacers therefrom, with the remainder of the silicon dioxide being removed as is well known to those skilled in the art leaving the structure shown in FIG. 4, with the gate oxide layer 20 etched away by the spacer layer etchant where the spacer layer 20 has been removed.

Perform an N+ implantation of As ions 19 into said substrate 10 in all areas exposed adjacent to the polysilicon structures 15 and 16 and spacer structures 20 forming N+ regions 23, 24 and 22, as shown in FIG. 5C.

SUMMARY OF THE INVENTION

Aside from the use of a second spacer on some devices the Sheng et al reference bears no similarity to the device of this invention.

A first advantage of this invention is that it improves the cell ratio.

Another advantage of this invention is that it reduces cell size.

For a geometry smaller than 0.5 μm, this method can improve cell $V_{ss}$ Resistance and can improve cell stability.

A solution to the problem in accordance with this invention is to implant the N+ region before spacer formation to avoid the problem of FIG. 3, a type of SRAM Drive (pull down) device, where a sub-half-micrometer spacer will block the N+ S/D implant or increase the S/D resistance.

In accordance with this invention, an SRAM cell and a process for forming an SRAM cell in accordance with this invention comprises:

a) forming a gate oxide layer on a semiconductor substrate, b) forming a gate structure on the gate oxide layer, c) forming a first ion implantation into the substrate in areas adjacent to the gate structure, d) performing a second ion implantation in an area immediately adjacent to the gate structure, e) depositing a dielectric layer over the gates, f) etching the dielectric layer to form a spacer structure therefrom, with the remainder of the dielectric layer being removed by the etching, and g) a third ion implantation in the substrate in all regions adjacent to the gates and the spacer structure forming more highly doped regions adjacent to the gate structure and the spacer structure.

In another aspect of this invention, a process for fabrication of an SRAM cell in accordance with this invention comprises a) formation of a gate oxide layer on a semiconductor substrate, b) formation of a gate layer on the gate oxide layer, c) formation of a first mask, d) etching the gate layer through the mask to form gate structure from the gate layer, e) performing a first ion implantation into the substrate in all areas exposed adjacent to the gate structure, f) then forming a second mask for a second ion implantation, g) performing a second ion implantation step through the second mask, h) removing the second mask, i) depositing a dielectric layer over the gates, j) etching the dielectric layer to form a spacer structure therefrom, with the remainder of the dielectric layer being removed by the etching, and k) then performing a third ion implantation into the substrate in all regions exposed adjacent to the gates and the spacer structure forming more highly doped regions.

Further in accordance with this invention, the first ion implantation includes a dose of phosphorous ions implanted within the range from about $1\times10^{13}/cm^2$ to about $4\times10^{13}/cm^2$ at from about 40 keV to about 80 keV; the second ion implantation includes a dose of arsenic ions implanted within the range from about $5\times10^{14}/cm^2$ to about $2\times10^{15}/cm^2$ at from about 60 keV to about 80 keV; the third ion implantation includes a dose of arsenic ions implanted within the range from about $1\times10^{15}/cm^2$ to about $5\times10^{15}/cm^2$ at from about 60 keV to about 80 keV; and the second implantation is Juxtaposed with the gate structure.

BRIEF DESCRIPTION OF THE DRAWINGS

The foregoing and other aspects and advantages of this invention are explained and described below with reference to the accompanying drawings, in which.

DESCRIPTION OF THE PREFERRED EMBODIMENT

The solution to problem of excessive $V_{ss}$ resistance is to implant the N+ regions in the substrate adjacent to the polysilicon gate structures before spacer formation, to avoid the problem of the FIG. 3 type of SRAM Drive (pull down) device, where a sub-half-micrometer spacer will block the N+ S/D implant or increase the S/D resistance.

The advantages achieved by employing the novel process in accordance with this invention are as follows:

1. Improvement of the cell ratio.
2. Reduction of cell size
3. Improvement of cell $V_{ss}$ Resistance- improve cell stability for geometries smaller than 0.5 μm.

FIG. 4 shows an SRAM device 9 in accordance with this invention having an improved asymmetrical LDD (Lightly Doped Drain) structure. The device includes a gate oxide layer 34 upon which a pair of polysilicon gates 35 and 36 are formed with spacers 40 on either side thereof. Beneath all of the spacers 40 are N− doped regions 33, 32 and 31 adjacent to the polysilicon gate 35 and 36. Beyond the spacers 40 and N− doped regions 31 are N+ doped regions 43 and 42 which have higher concentrations of dopant added after the N− dopant has been implanted and the spacers 40 have been formed. A feature in accordance with this invention which is a key difference from the prior art is that the region 24 beneath the region 32 between polysilicon gates 35 and 36 and beneath the N− region 32 is doped N+.

The process of formation of a device of the kind shown in FIG. 4 is described here in connection with FIGS. 6A–6D to illustrate the problem of providing an adequate level of dopant in the space between adjacent gate elements 35 and 36, in more detail.

The process shown in FIGS. 6A–6D preferably comprises the steps as follows:

Form a gate oxide layer 34 on a silicon semiconductor substrate 30, as is well known to those skilled in the art.

Form a polysilicon layer to be used to form gate structures 35 and 36 on the gate oxide layer by forming a polysilicon layer on the gate oxide layer.

Form a mask for polysilicon gate structures by use of photolithography.

Perform an etching process in accordance with the art, as shown in FIG. 5A to form the gate structures 35 and 36 from the polysilicon layer.

Perform an N− ion implantation of P ions 37 into the substrate 30 in all areas exposed adjacent to the polysilicon structures 35 and 35 forming N− regions 33, 32 and 31, as shown in FIG. 5A. The dose of the P ions 37 implanted is within the range from about $1\times10^{13}/cm^2$ to about $4\times10^{15}/cm^2$ at from about 40 keV to about 80 keV.

Form an N+ photoresist mask 38 on the device of FIG. 5A.

Perform an N+ ion implantation step of As ions into regions which are not covered by the mask which are not shown in this view. The dose of the As ions implanted is within the range from about $5\times10^{14}/cm^2$ to about $4\times10^{13}/cm^2$ at from about 40 keV to about 80 keV. No such ion implantation step is performed in the prior art.

Remove the photoresist mask 38.

Perform a CVD silicon dioxide deposition of layer 40 over the device covering the polysilicon gates 35 and 36, etc.

Etch the silicon dioxide layer 40 to form spacers therefrom, with the remainder of the silicon dioxide being removed as is well known to those skilled in the art leaving the structure shown in FIG. 4, with the gate oxide layer etched away by the spacer layer etchant where the spacer layer 40 has been removed.

Figure 6D:
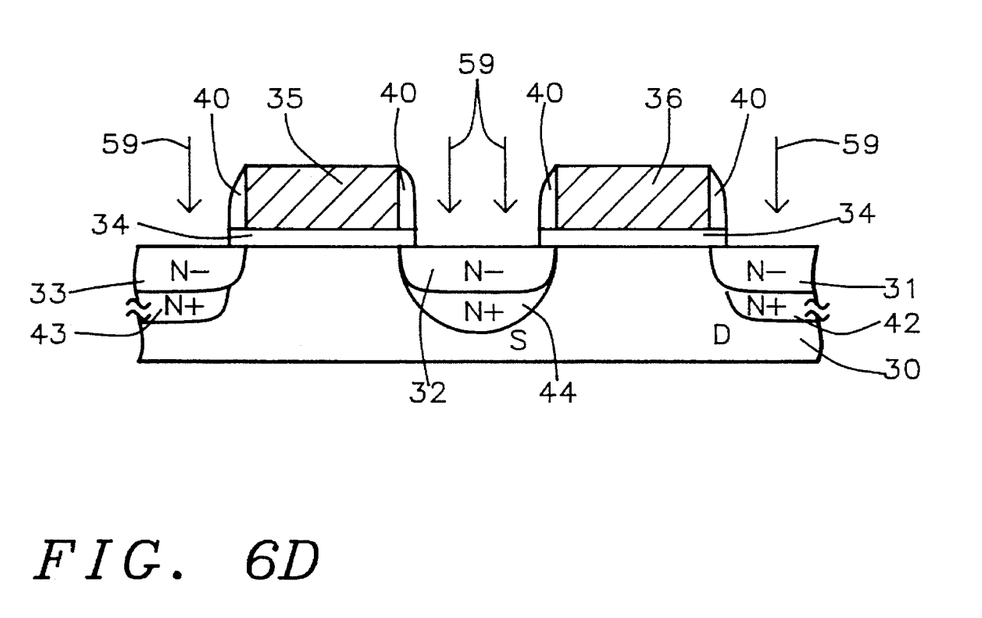

Perform an N+ implantation of As ions 59 into the substrate 30 in all regions 42, 43 and 44 exposed adjacent to the polysilicon structures 35 and 36 and spacer structures 40 forming N+ regions 42, 43 and 44, as shown in FIG. 6D. The dose of the As ions implanted is within the range from about $1\times10^{15}/cm^2$ to about $5\times10^{15}/cm^2$ at from about 60 keV to about 80 keV.

Figure 8A:
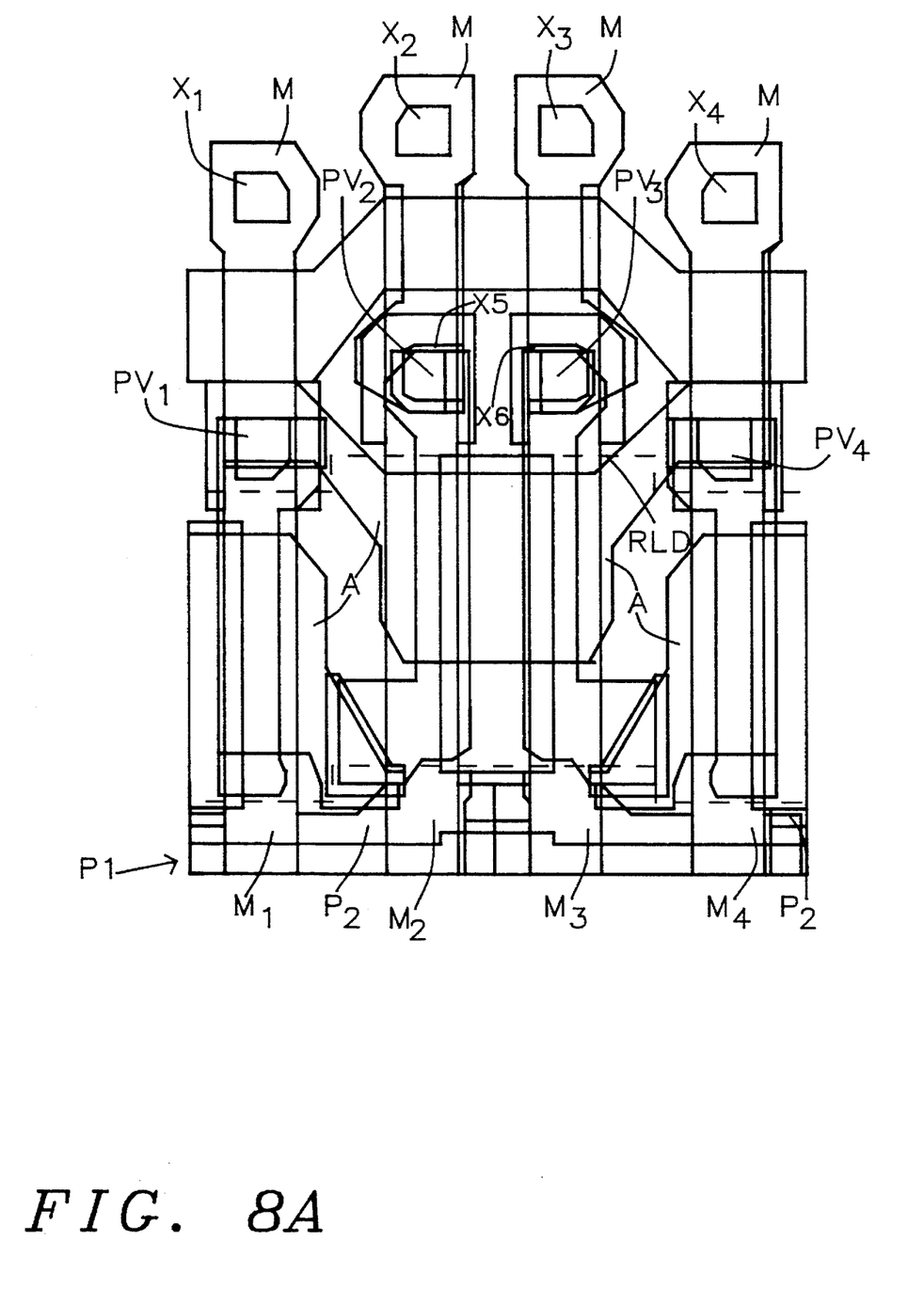
FIGS. 8A, 8B and 8C show plan views of a layout of a completed structure of a device in accordance with this invention with various layers of the layout illustrated in the different figures.
Figure 8B:
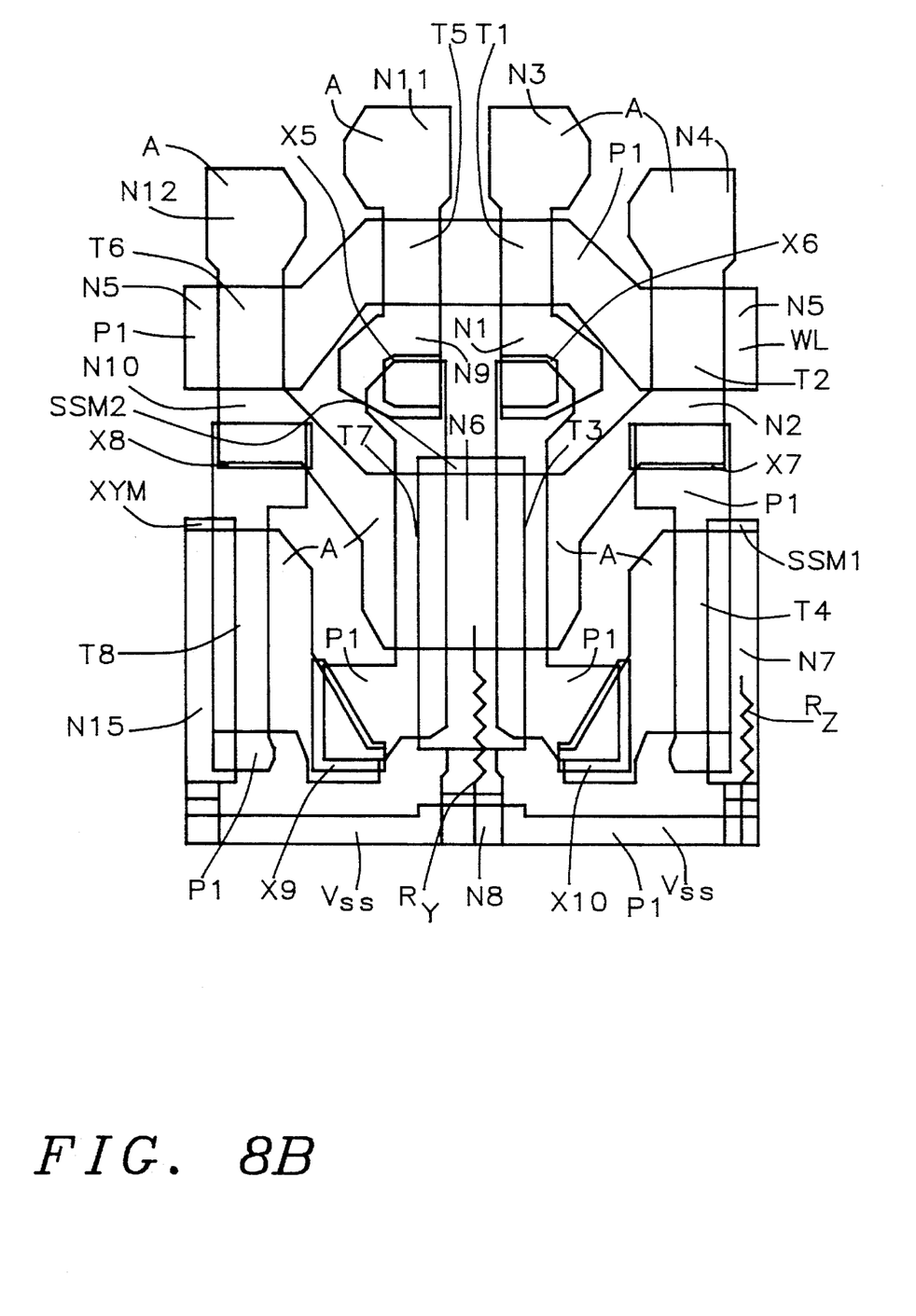
Figure 8C:
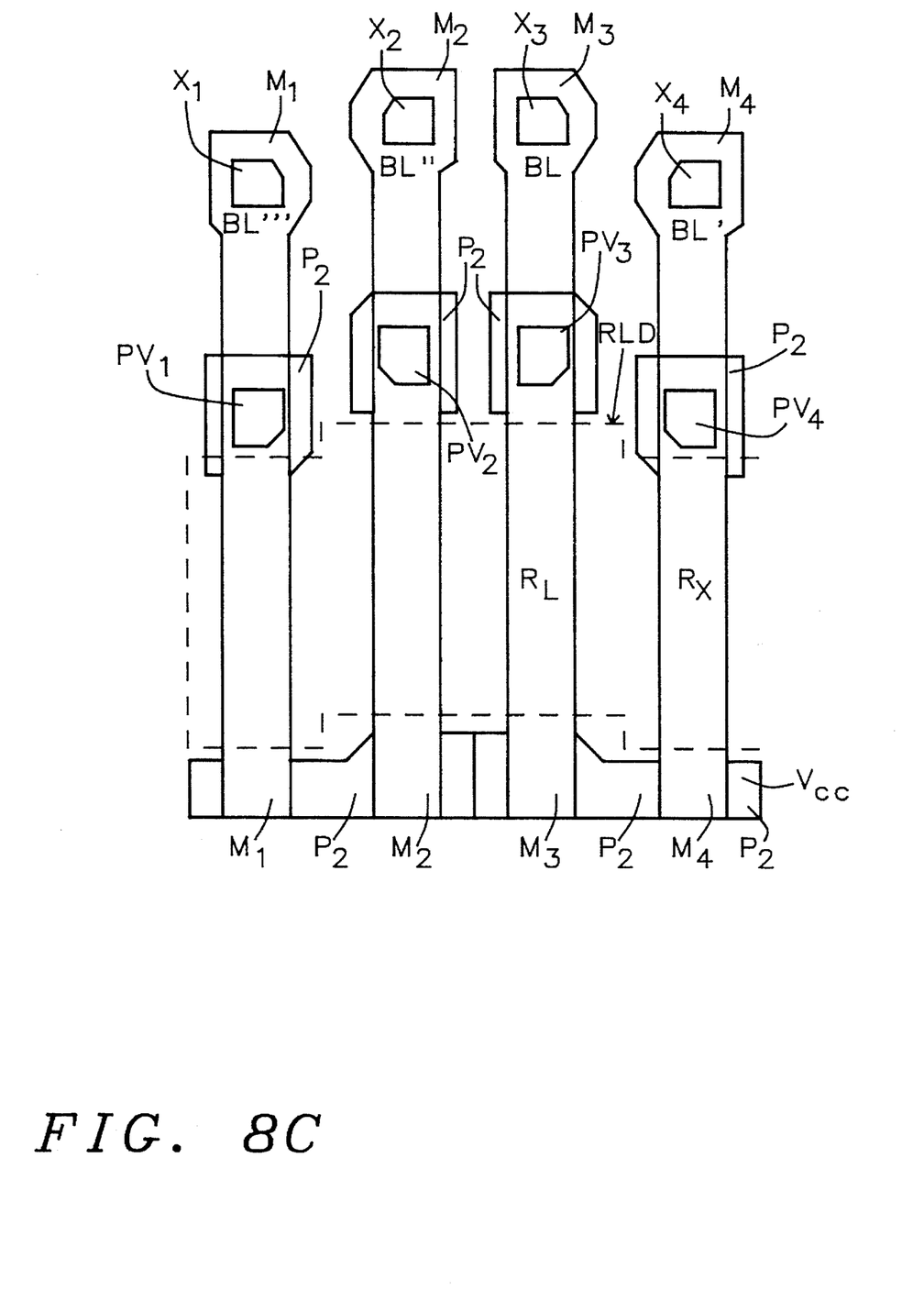

FIGS. 7 shows a schematic circuit diagram of an SRAM cell and FIGS. 8A, 8B and 8C show plan views of a layout of a completed structure of a device in accordance with this invention with various layers of the layout illustrated in the different figures.

The SRAM cell of FIG. 7 comprises two cross-coupled transistors comprising N-channel transistor T3 and n-channel transistor T4, with their gates connected respectively to nodes N2 and N1.

In addition, the SRAM cell of FIG. 7 includes two N-channel pass transistors T1 and T2 and two resistors, load resistor $R_L$ connected between terminal $V_{cc}$ and node N1 which is connected to the S/D circuit of transistor T4, resistor $R_x$ connected between terminal $V_{cc}$ and node N2 which is connected to the S/D circuit of transistor T3, S/D resistor $R_y$ connected between $V_{ss}$ (ground level) and node N6 which is connected in series with the source side of the drive device T4, S/D resistor Rz connected between voltage source $V_{ss}$ and node N7 which is connected in series with source side of drive device T3.

Pass transistor T1 and pass transistor T2 have their gates connected to node N5 (word line WL) and their source drain circuits respectively connected between node N1 and node N3 for transistor T1 and node N2 and node N4 for transistor T2.

Node N3 and node N4 are connected respectively to the bit line BL and bit line BL'.

Node N5 (which as stated above is connected to the gates of transistors T1 and T2) connects to the word line WL.

FIGS. 8A, 8B and 8C shows a plan views of various stages of processing of an SRAM device in accordance with this invention, wherein polysilicon 1 gate G, a resistor Rz, and the set of transistors T1, T2, T3 and T4 are indicated.

A source side mask SSM1 is shown for T4 and source side mask SSM2 is shown for T3, T7 in FIG. 8B. An active element A is shown above transistor T2. Word line WL is shown passing over transistor T2 and transistor T1 (NODE N5).

Resistors Ry (which has an equal resistance of resistor Rz) and resistor Rz are S/D resistors connected between Vss (ground line) and nodes N6 and N7 respectively which are connected in series with the source side of the respective drive devices transistor T3 and transistor T4.

Transistor T5 is analogous to transistor T1 in FIG. 7.

Transistor T6 is analogous to transistor T2 in FIG. 7.

Transistor T7 is analogous to transistor T3 in FIG. 7.

Transistor T8 is analogous to transistor T4 in FIG. 7.

There is a source side mask XYM for transistor T8.

Node N1 is composed of source/drain of transistor T1, polysilicon gate of transistor T3, the drain of transistor T4, and resistor $R_L$ is connected thereto by buried contact X6, X10 and polysilicon via PV3 as seen in FIGS. 8B and 8C.

Node N2 is composed of the source/drain of transistor T2, polysilicon gate of transistor T4, drain of transistor T3, and polysilicon load resistor Rx which is connected to buried contact X7 and polysilicon via PV4 as seen in FIGS. 8B and 8C.

Node N3 is composed of active material connected to transistor T1 and contact X3 as seen in FIG. 8C, which is connected to metal BL (M3).

Node N4 is composed of active material connected to transistor T2 and contact X4 as seen in FIG. 8C, which is connected to BL' (M4.)

Node N5, which is connected to the word line WL, as seen in FIG. 7, is composed of polysilicon 1 material P1 and is connected to transistors T1, T2, T5, and T6.

Node N6 which is associated with second source side mask SSM2 is connected to one end of resistor $R_y$, as shown in FIG. 7.

Node N7 is connected between transistor T4 and resistor $R_z$ as shown in FIG. 7 and is associated with source side mask SSM1.

Node N8 is composed of polysilicon material P1 connected to resistor Ry and resistor Rx as seen in FIG. 7. Node N8 is connected to the terminal Vcc as shown in FIG. 7.

Node N9 is analogous to node N1 in FIG. 8B.

Node N10 is analogous to node N2 in FIG. 8B.

Node N11 is analogous to node N3 in FIG. 8B.

Node N12 is analogous to node N4 in FIG. 8B.

The larger the ratio, the better to improve cell stability. Pull down transistors T3 and T4 are asymmetrical LDD (Lightly Doped Drain) devices. Transistors T1 and T2, which are symmetrical, are LDD devices.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by Letters Patent is as follows:

1. A process for fabrication of an SRAM cell comprising
   a) formation of a gate oxide layer on a semiconductor substrate,
   b) formation of a gate layer on said gate oxide layer,
   c) formation of a first mask,
   d) etching said gate layer through said mask to form gate structure from said gate layer and exposing areas adjacent to said gate structure,
   e) performing a first ion implantation into said substrate in all exposed areas adjacent to said gate structure,
   f) then forming a second mask for a second ion implantation,
   g) performing a second ion implantation step through said second mask at least one exposed area adjacent to said gate structure,
   h) removing said second mask,
   i) deposition of a dielectric layer over said gate structure,
   j) etching said dielectric layer to form a spacer structure therefrom, with the remainder of said dielectric layer being removed by said etching, and
   k) performing a third ion implantation into said substrate in all regions exposed adjacent to said gate structure and said spacer structure forming more highly doped regions.

2. The process of claim 1 wherein said first ion implantation includes a dose of phosphorous ions implanted within the range from about $1\times10^{13}/cm^2$ to about $4\times10^{13}/cm^2$ at from about 40 keV to about 80 keV.

3. The process of claim 1 wherein said second ion implantation includes a dose of arsenic ions implanted within the range from about $5\times10^{14}/cm^2$ to about $2\times10^{15}/cm^2$ at from about 60 keV to about 80 keV.

4. The process of claim 1 wherein said third ion implantation includes a dose of arsenic ions implanted within the range from about $1\times10^{15}/cm^2$ to about $5\times10^{15}/cm^2$ at from about 60 keV to about 80 keV.

5. The process of claim 1 wherein said second implantation is juxtaposed with said gate structure.

6. The process of claim 5 wherein said first ion implantation includes a dose of phosphorous ions implanted within the range from about $1\times10^{13}/cm^2$ to about $4\times10^{13}/cm^2$ at from about 40 keV to about 80 keV.

7. The process of claim 5 wherein said second ion implantation includes a dose of arsenic ions implanted within the range from about $5\times10^{14}/cm^2$ to about $2\times10^{15}/cm^2$ at from about 60 keV to about 80 keV.

8. The process of claim 5 wherein said third ion implantation includes a dose of arsenic ions implanted within the range from about $1\times10^{15}/cm^2$ to about $5\times10^{15}/cm^2$ at from about 60 key to about 80 keV.

\* \* \* \* \*